United States Patent
Oppermann

(10) Patent No.: US 8,299,613 B2
(45) Date of Patent: Oct. 30, 2012

(54) METHOD FOR CONNECTING TWO JOINING SURFACES

(75) Inventor: Hermann Oppermann, Berlin (DE)

(73) Assignee: Fraunhofer-Gesellschaft zur Förderung der Angewandten Forschung E.V. (DE)

( * ) Notice: Subject to any disclaimer, the term of this patent is extended or adjusted under 35 U.S.C. 154(b) by 132 days.

(21) Appl. No.: 12/742,176

(22) PCT Filed: Nov. 14, 2008

(86) PCT No.: PCT/EP2008/009834
§ 371 (c)(1),
(2), (4) Date: Jul. 13, 2010

(87) PCT Pub. No.: WO2009/062757
PCT Pub. Date: May 22, 2009

(65) Prior Publication Data
US 2010/0270673 A1    Oct. 28, 2010

(30) Foreign Application Priority Data

Nov. 14, 2007  (DE) .......................... 10 2007 055 017

(51) Int. Cl.
*H01L 29/40* (2006.01)
(52) U.S. Cl. ............... 257/739; 257/741; 257/E21.532; 257/E23.169; 438/107; 977/712; 977/775
(58) Field of Classification Search ............... 257/739, 257/741, 775, E21.532, E23.169, 777, 778, 257/783, 788–795, E27.137, E27.144, E27.161, 257/E51.023, 734; 438/107; 977/775, 712
See application file for complete search history.

(56) References Cited

U.S. PATENT DOCUMENTS

| | | | |
|---|---|---|---|
| 5,641,996 A * | 6/1997 | Omoya et al. ................ | 257/787 |
| 5,783,465 A | 7/1998 | Canning et al. | |
| 7,180,197 B2 * | 2/2007 | Nishi et al. .................... | 257/783 |
| 2007/0259515 A1 | 11/2007 | Paik et al. | |

FOREIGN PATENT DOCUMENTS

| | | |
|---|---|---|
| DE | 19958328 A1 | 7/2001 |
| EP | 0392738 | 10/1990 |
| JP | 2003174055 | 6/2003 |
| WO | WO 2006/099885 | 9/2006 |
| WO | PCT/EP2008/009834 | 3/2009 |

OTHER PUBLICATIONS

"Investigation of dealloying in Au—Ag thin films by quantitative electron probe microanalysis", Scripta Materialia, Elsevier, Amsterdam, NL, Bd. 56, Nr. 7, Jan. 30, 2007, Seiten, 557-560, XP005866029, ISSN: 1359-6462.
"Dealloying of Au—Ag thin films with a composition gradient: Influence on morphology of nanoporous Au", Thin solid films, Elsevier-Sequoia S.A. Lausanne, Ch, May 24, 2007, Seiten, 7122-7126, XP022094444, ISSN: 0040-6090.

* cited by examiner

*Primary Examiner* — Jasmine Clark
(74) *Attorney, Agent, or Firm* — Altera Law Group, LLC

(57) ABSTRACT

The invention relates to a method for connecting two joining surfaces, particularly in the field of semiconductors, wherein at least one joining surface is produced by depositing a layer comprising 20 to 40% gold and 80 to 60% silver onto a substrate and selectively removing the silver from the deposited layer in order to produce a nanoporous gold layer as a joining surface. The joining surface with the nanoporous gold layer and an additional joining surface are disposed one above the other and pressed together.

Figure 1:
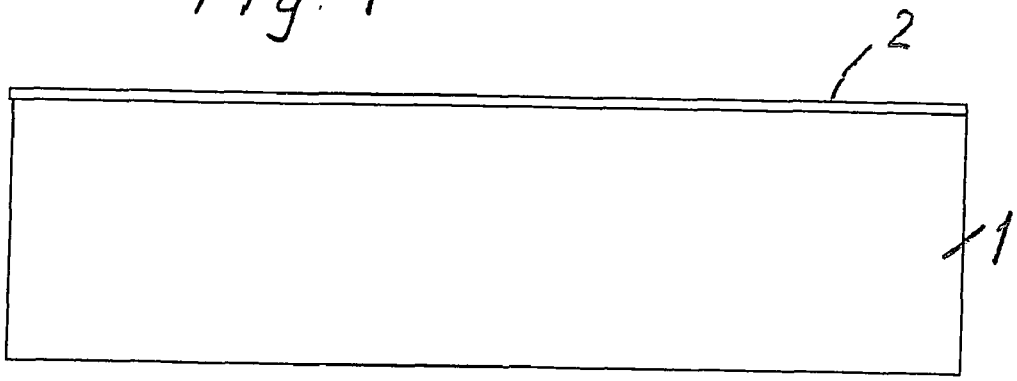
Figure 1:
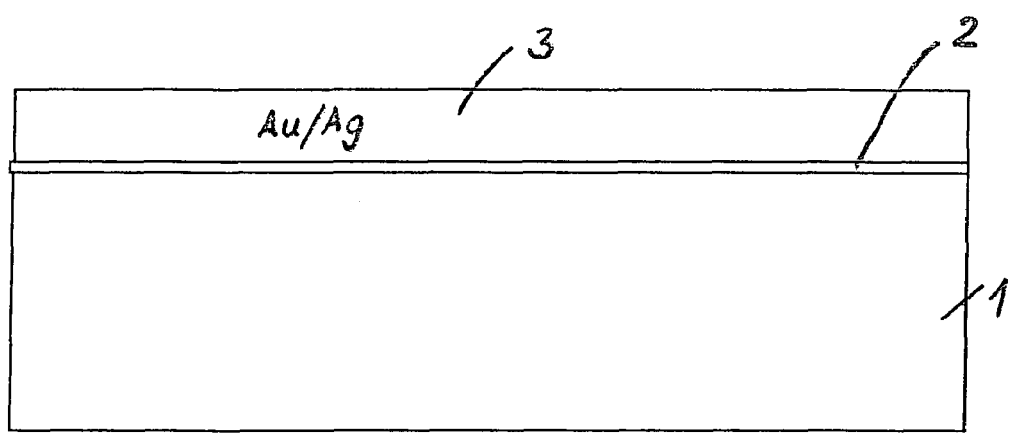
Figure 1:
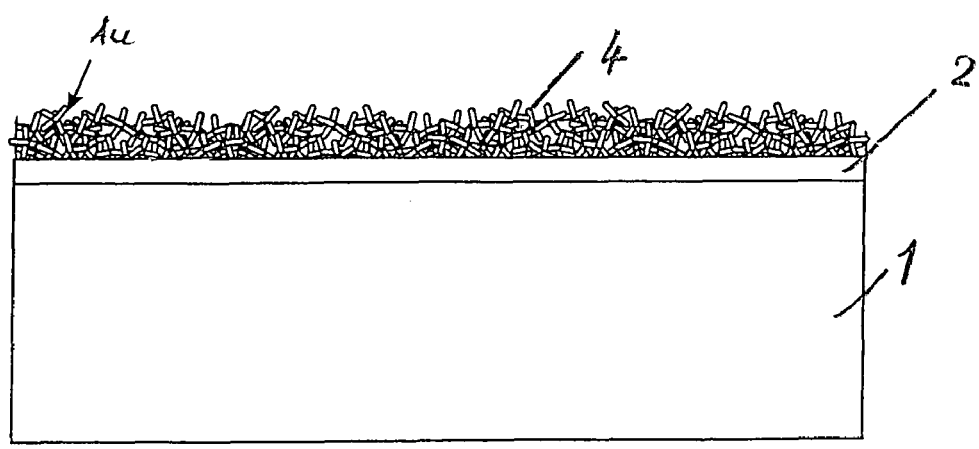

30 Claims, 3 Drawing Sheets a b c

METHOD FOR CONNECTING TWO JOINING SURFACES

The invention relates to a method for connecting two joining surfaces, in particular for applications in microelectronics, micromechanics or microoptics, at least one joining partner comprising a semiconductor material, and also a component produced therewith.

In microsystem technology and semiconductor technology, components are connected to each other via the most varied of methods or to substrates or the like. One main method is bonding which can be produced in the most varied of ways. For example wire bonding, flip-chip bonding, die bonding, wafer bonding and the like are thus known. The more or less large, two-dimensional surface connections can thereby be produced with or without intermediate layers. Methods without intermediate layers are for example cold welding in which two surfaces are connected to each other permanently by applying pressure and temperature (thermocompression) or friction welding (thermosonic) in which an additional movement takes place parallel or perpendicular to the connection plane which assists the connecting process. An important component is convergence of the contact surface by levelling the surface roughness and subsequent diffusion in order to reduce the stresses and to increase the contact surfaces. In order to produce a good connection, high forces and/or high bonding temperatures must be applied or a large ultrasonic power must be introduced.

One possibility for connecting to an intermediate layer is glueing with an electrically or thermally conductive adhesive, the adhesive matrix being provided with filling particles. In order to minimise the thermal or electrical resistance of a connection, there is a requirement for two preconditions which are provided by as small as possible an adhesive gap and a large number of conducting paths (percolation path) via the filling particles from one side to the other side. In this first case, the deviations in the coplanarity of the joining surfaces limit the minimum adhesive gap. On the second point, high conductivity is achieved if the conducting path comprises only a few particles and the particles are disposed such that many such paths are produced.

The object underlying the invention, for applications in microelectronics, micromechanics or microoptics, is to produce a method for connecting two joining surfaces which achieves high compressibility of the joining surfaces and compensation for unevennesses, the necessary contact pressures being intended to be less in comparison with the state of the art.

This object is achieved according to the invention by the features of the main claim.

Advantageous developments and improvements are possible as a result of the measures indicated in the sub-claims.

As a result of the fact that at least one joining surface is produced by depositing a layer comprising 20% to 40% gold and 60% and 80% silver onto a substrate and selectively removing the silver from the deposited layer in order to produce a nanoporous gold layer and as a result of the fact that the joining surface with the nanoporous gold layer and a further joining surface are disposed one above the other and pressed together, convergence of the joining surfaces at low pressure and possibly low temperatures is made possible because of the high compressibility of the nanoporous gold layer. In the case of bonding, the nanoporous gold layer is extensively compressed and the pores are pressed together. If advantageously the second joining surface is configured likewise with a nanoporous layer, the mentioned phenomena are increased even more. The sponge-like structure of the joining surfaces allows bonding of non-planar surfaces since the high compressibility of the sponge structure enables compensation for the unevennesses on connecting surfaces. As a result, in comparison with compact layers, substantially higher surface proportions are connected to each other.

The method according to the invention can be applied for the most varied of connection technologies. Two-dimensional connections are achieved for the bonding of individual chips on substrates but also wafer-to-wafer bonding. For flip-chip connections, small connecting structures, such as sponge-like metal bumps, are preferably used. Annularly disposed metal structures with sponge-like surfaces are suitable for achieving a hermetic seal. Sponge-like connection metallisations can also be used for welding during wire bonding, thermocompression welding and also thermosonic bonding being used.

When using a connecting agent between the joining surfaces which is liquid or pasty at least at times, the connecting agent can penetrate into the pores of the nanoporous gold layer, as a result of which good distribution over the entire joining surface becomes possible.

The use of a connecting agent with thermally and/or electrically conductive filling particles is particularly advantageous, the connecting agent being able to be an adhesive or even a lubricant or a gel or a heat conducting paste (thermal grease). The invention allows in particular, when pressure is applied from outside, penetration of the conductive particles into the compressible joining surface, with which a larger contact surface is achieved between particle and surface of the joining partner and hence less constriction resistance between particle and joining surface. Furthermore, because of the compressibility of the joining surfaces, a larger number of continuous conducting paths is produced, which lowers the resistance. Excess quantities of adhesive can be absorbed by the pores of the joining surface. Similar results apply for the lubricant (thermal grease). Under pressure, the lubricant is pressed into the pores of the metallic sponge and the remaining filling materials can be compacted more strongly. In addition, these filling materials penetrate into the compressible sponge structure and reduce the thermal resistance.

The adhesive matrix or the lubricant, as mentioned, can penetrate into the pores of the gold sponge and hence increase the particle filling density in the gap. The adhesion of the adhesive to the contact surface is improved by the mechanical interlocking. When applying force, the filling particles press together the sponge structure against the contact points, compress these, these being surrounded by the metallic sponge. In contrast to the state of the art in which the filling material provides only contact at points, in the invention surface contact is the case. As a result, the electrical and/or thermal resistance is reduced.

In the method according to the invention, the Ag/Au layer used in the intermediate step can be produced simply in a known deposition process, electrochemical deposition, deposition by means of electron beam evaporation or sputtering being able to be chosen. Also the silver can be removed by normal processes, for example by reverse electrolysis of the galvanic deposition process or by external currentless etching.

The nanoporous compressible gold layer with a high continuous pore proportion and high freely accessible surface can be produced on any substrates. By varying the composition of the gold and of the silver, the density of the achieved nanoporous gold layer can be varied.

Advantageously, the sponge-like gold layer can be pretreated in its surface, for example by reactive ion etching or hydrophilising in order to improve the wetting.

An advantageous method step is that the joining surfaces are heated before, during and/or after the pressing together under contact pressure.

Corresponding to the purposes of use, the nanoporous gold layer of at least one joining surface can be structured.

By providing a tempering process after production of the nanoporous gold layer, the size of its pores can be adjusted.

The method according to the invention can be applied for die bonding by means of thermocompression, for die bond glueing, both for example for power components, LEDs, processors, for a cooling assembly on the rear-side of a chip, e.g. in the case of processors, for flip-chip thermocompression bonding, flip-chip thermosonic bonding, flip-chip glueing, wire bonding on sponge-like metal pads and for wafer-to-wafer bonding with metallic sponge structures.

Figure 2:
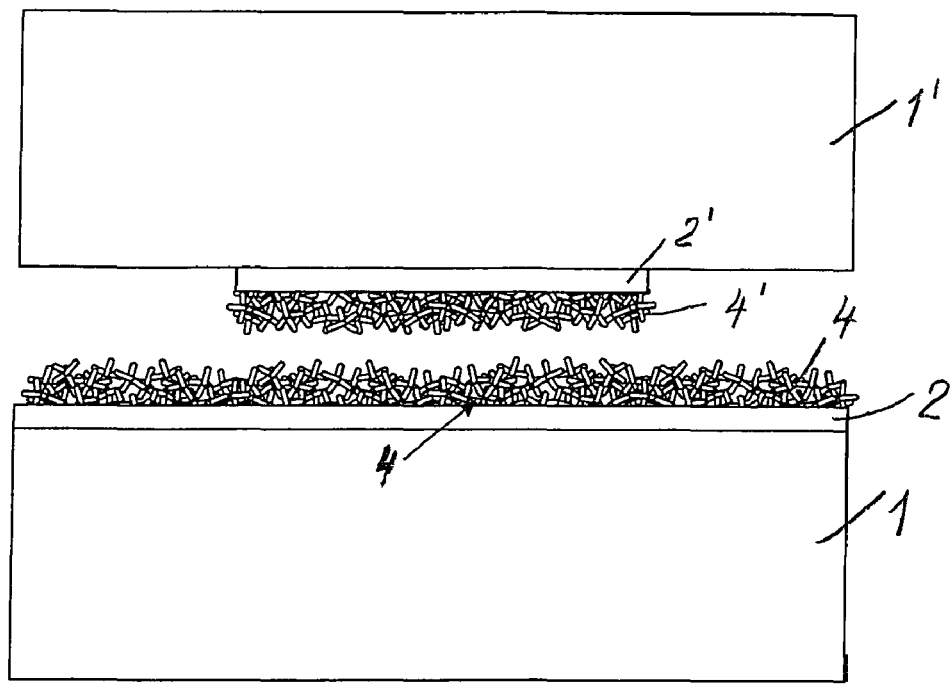
Figure 2:
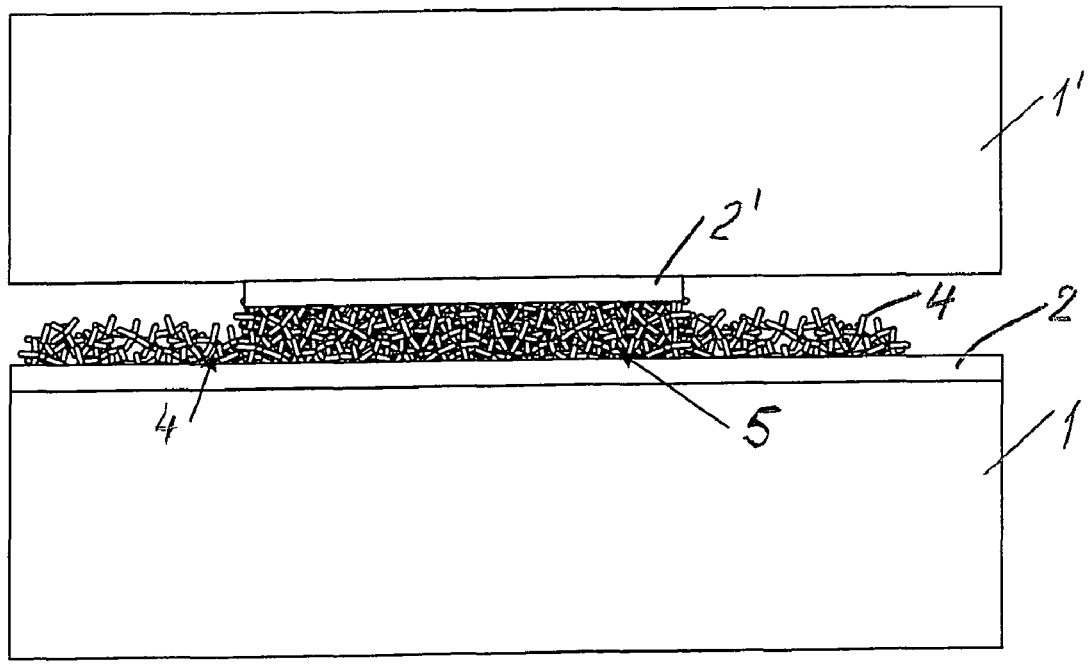

The method according to the invention is explained in more detail in the subsequent description using the accompanying drawings. There are shown FIG. 1 schematically, the layer construction with different method steps for producing the nanoporous gold layer for a joining surface, FIG. 2 schematically, a section through two substrates provided with the joining surfaces, in the unconnected and joined state, and FIG. 3 a section through an arrangement comprising substrates provided with joining surfaces and an adhesive layer with filling particles in the pressed-together state.

In the case of the method according to the invention, two components provided with joining surfaces are connected, at least one of the joining surfaces being configured as a nanoporous gold layer.

In the following, the basic production steps of a nanoporous gold layer are intended to be described with reference to FIG. 1 with the essential method steps.

First of all, corresponding to FIG. 1a, a plating base 2 in the form of a layer for adhesion strengthening, for example made of titanium, titanium/tungsten or chromium, is applied on the substrate and, thereupon, a starter layer made of gold, nickel, copper or platinum, this being able to take place by sputtering.

As a further essential step corresponding to FIG. 1b, a galvanic deposition of a gold/silver alloy is undertaken, the alloy-forming metallic elements being present firstly in an electrolyte and the electrochemical deposition from the electrolyte takes place by applying a voltage. The composition of the gold/silver deposition is thereby in a range of 20% to 40% gold and 60% to 80% silver. As intermediate step corresponding to FIG. 1b, a gold/silver layer 3 is therefore situated on the starter layer 2.

Between FIG. 1b and the representation according to FIG. 1c in which a nanoporous gold layer 4 merging into the starter gold layer 2 is represented, the dissolving of the silver out of the layer 3 takes place, this selective dissolving or dealloying being able to be implemented in different ways. One possibility, in particular if electrochemical deposition is used, is reverse electrolysis of the principle of galvanic deposition in a suitable electrolyte, in which a voltage is applied to the electrodes, by means of which the silver is dissolved out but the gold is not affected. Another possibility is selective dealloying by external currentless etching of the silver, e.g. in nitric acid-containing solutions.

In the process for dissolving out the silver, a surface reaction takes place in the Ag/Au layer 3, during which reaction silver from the uppermost metal layer goes into solution as ion. The remaining Au atoms accumulate on the surface to form islands and protect the surface there selectively from further dissolution. Subsequently, silver is dissolved out of the next metal layer which is not covered by a gold island. By means of repeated accumulation of the moveable Au atoms from the layer, a 3D sponge layer with nanoscale pores grows slowly. The sponge-like nanoporous layer is designated in FIG. 1c with 4.

The deposition was described above by the electrochemical route, however the Ag/Au layer 3 can also be produced by vapour deposition, e.g. electron beam evaporation or sputtering. Similarly to FIG. 1a, an adhesive layer with materials generally used in thin-film technology is applied in advance. In the case of sputtering or cathode sputtering, the silver and the gold can be sputtered alternately or in parallel, the multilayers diffusing one into the other by tempering.

In the above description, only the main steps for producing the nanoporous layer 4 have been explained. Of course, further method steps are interposed.

Thus between the illustrations of FIGS. 1a and 1b, a photosensitive lacquer is applied and, corresponding to the specifications of the layer configuration, is structured lithographically. This thus produced lacquer mask can be removed again, according to the method course, before and after the selective dealloying of the silver.

If the plating base 2 is intended to be etched away, a second lacquer mask is structured for protection of the nanoporous gold layer 4 and subsequently the plating base is etched. After removing this second lacquer mask, possibly further structurings of the nanoporous or sponge-like gold layer 4 can be undertaken.

In FIG. 2, two electronic components which are connected to each other via nanoporous gold layers are represented and are designated here merely as substrate 1 and substrate 1'. In order to connect them, the substrates 1, 1' are disposed one above the other in the desired configuration (FIG. 2a) and the joining surfaces, here the nanoporous gold layers 4, 4', are pressed together (FIG. 2b). This takes place possibly by heating and in fact before, during and/or after application of the contact pressure. As can be detected, the gold layers 4, 4' are compressed and the pores are pressed together, which is represented by the region 5. An additionally supplied ultrasound can assist the connecting process. The hereby produced friction energy assists the joining process. The ultrasound can act both vertically and horizontally on the joining surface.

Figure 3:
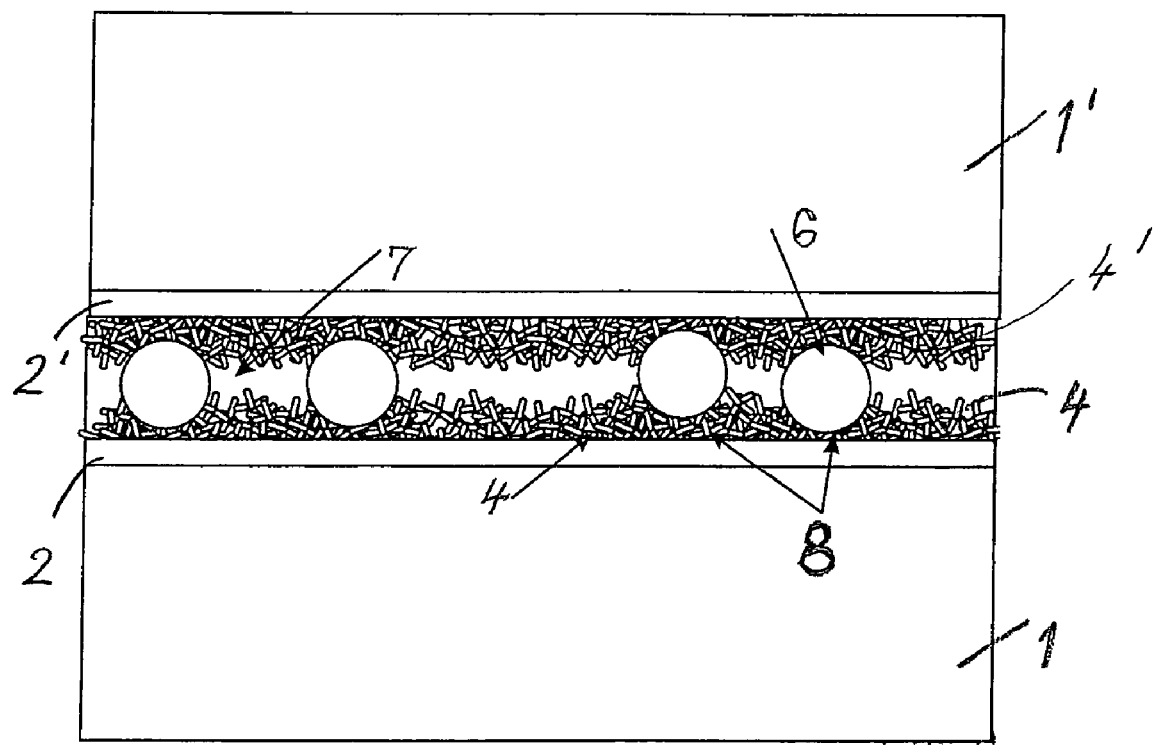

In FIG. 3, the connection of two substrates 1, 1' provided with respectively nanoporous gold layers 4, 4' is represented, with interposition of a connecting agent, here adhesive 7, provided with filling particles 6. The gold layers 4, 4' are produced as described above and are structured possibly corresponding to the type of respective connection. In order to achieve better wetting by the adhesive, the surfaces of the sponge-like gold layers 4, 4' can be pre-treated for example by reactive ion etching or by hydrophilising. Subsequently, the adhesive 7 with the filling particles 6, for example made of Ag, Ni, Au, $Al_2O_3$, BeO, AlN, diamond or the like, are applied on at least one of the joining surfaces, i.e. on at least one of the gold layers 4, 4'. As previously, the joining surfaces are disposed one above the other and pressed together, heating possibly being undertaken under contact pressure. The adhesive 7 works its way into the pores of the sponge-like gold layers 4, 4' and, via the filling particles 6, the pores in the region of the filling particles 6 are pressed together so that compressed gold zones 8 are produced. Hence, many paths are formed with high conductivity and reduced resistance. According to the application case, the adhesive 7 can possibly be polymerised, crosslinked and cured.

Similarly, a lubricant or gel or a heat conducting paste (thermal grease) can be disposed between the joining surfaces or the sponge-like gold surfaces 4, 4', for example in order to dissipate the heat of a processor to be disposed on a substrate.

If these lubricants have no adhesive properties, the constant contact pressure must be achieved by another measure, for example by spring contacts, clamps or screw connections.

The invention claimed is:
1. Method for connecting two joining surfaces, in particular in semiconductor technology, having the steps:
   a) producing at least one joining surface by
      depositing a layer comprising 20 to 40% gold and 60 to 80% silver onto a substrate and
      selectively removing the silver from the deposited layer in order to produce a nanoporous gold layer as joining surface,
   b) arranging the joining surface with the nanoporous gold layer and a further joining surface one above the other,
   c) pressing together the joining surfaces.
2. Method according to claim 1, wherein the substrate comprises a metallic layer, in particular on a layer formed from gold, prior to the production of the at least one joining surface according to step a), wherein the layer comprising 20 to 40% gold and 60 to 80% silver is deposited onto the metallic layer of the substrate.
3. Method according to claim 1, wherein the nanoporous gold layer is deposited on semiconductor materials, in particular on wafers with microelectronic circuits or micromechanical elements.
4. Method according to claim 1, wherein the further joining surface is configured, according to feature a), with the nanoporous layer.
5. Method according to claim 1, wherein a connecting agent which is liquid or pasty at least at times is applied on at least one joining surface.
6. Method according to claim 5, wherein the connecting agent is provided with thermally and/or electrically conductive filling particles.
7. Method according to claim 5, wherein adhesive is applied on the at least one joining surface.
8. Method according to claim 5, wherein lubricant, gel or heat conducting paste is applied on the at least one joining surface.
9. Method according to claim 1, wherein the nanoporous gold layer of at least one joining surface is structured.
10. Method according to claim 1, wherein the joining surfaces are heated, the heating being undertaken before, during and/or after the pressing together under contact pressure.
11. Method according to claim 1, wherein the joining surfaces are supplied vertically and/or horizontally with ultrasound under contact pressure.
12. Method according to claim 5, wherein the connecting agent is polymerized, crosslinked and cured.
13. Method according to claim 1, wherein the nanoporous gold layer is pre-treated for example by reactive ion etching, hydrophilizing or the like in order to improve the wetting.
14. Method according to claim 6, wherein the filling particles comprise gold, silver, nickel, ceramic, graphite, aluminum nitride, boron nitride, beryllium oxide or the like.
15. Method according to claim 1, wherein the deposition of the layer made of gold and silver is implemented by a galvanic or electrochemical route.
16. Method according to claim 1, wherein the deposition of the layer made of gold and silver is implemented by vapor deposition or sputtering.
17. Method according to claim 1, wherein, before the deposition of the layer made of gold and silver, a plating base with adhesion strengthening is applied on the substrate.
18. Method according to claim 16, wherein an adhesive layer is applied.
19. Method according to claim 17, wherein the plating base or adhesive layer is structured lithographically.
20. Method according to claim 1, wherein the selective removal of the silver is implemented by reverse electrolysis of the galvanic deposition.
21. Method according to claim 1, wherein the selective removal of the silver is implemented by etching of the silver.
22. Method according to claim 1, wherein, before or after the removal of the silver, the lacquer mask used for structuring the layer made of gold and silver to be deposited is removed.
23. Method according to claim 1, wherein the nanoporous gold layer is tempered in order to adjust the pore size.
24. Component with two joining surfaces to be connected, in particular for semiconductor technology, in which at least one joining surface comprises a nanoporous gold layer and the joining surfaces are disposed one above the other and pressed together.
25. Component according to claim 24, wherein both joining surfaces comprise a nanoporous gold layer.
26. Component according to claim 24, wherein a connecting agent which is liquid or pasty at least at times is applied between the joining surfaces.
27. Component according to claim 26, wherein the connecting agent is provided with thermally and/or electrically conductive filling particles.
28. Component according to claim 26, wherein the connecting agent is an adhesive.
29. Component according to claim 26, wherein the connecting agent is a lubricant, gel or a heat conducting paste.
30. Component according to claim 27, wherein the filling particles comprise gold, silver, nickel, ceramic, graphite, aluminum nitride, boron nitride, beryllium oxide or the like.

* * * * *